United States Patent [19]

Wong et al.

[11] Patent Number: 5,793,672

[45] Date of Patent: Aug. 11, 1998

[54] LOW POWER REGISTER MEMORY ELEMENT CIRCUITS

[75] Inventors: Jacques Ah Miow Wong, Santa Clara; Reuben A. Aspacio, Fremont, both of Calif.; Beng Chew Khou, Tampines, Singapore

[73] Assignee: Advanced Micro Devices, Inc., Sunnyvale, Calif.

[21] Appl. No.: 814,397

[22] Filed: Mar. 11, 1997

[51] Int. Cl.$^6$ .................................................. G11C 11/00
[52] U.S. Cl. .................. 365/154; 365/189.05; 365/227; 365/230.08
[58] Field of Search .................. 365/154, 189.05, 365/227, 230.08

[56] References Cited

U.S. PATENT DOCUMENTS 5,257,223  10/1993  Dervisoglu .......................... 365/154
5,500,817  3/1996  McLaury ............................ 365/189.05
5,530,676  6/1996  Sullivan et al. ....................... 365/227
5,535,171  7/1996  Kim et al. ........................... 365/233
5,648,930  7/1997  Randazzo ........................... 365/185.07

*Primary Examiner*—David C. Nelms
*Assistant Examiner*—Hien Nguyen
*Attorney, Agent, or Firm*—Emil Chang; Claude A. S. Hamrick; Oppenheimer W. Donnelly

[57] ABSTRACT

A flip-flop for storing a bit of digital information generally used in register architectures is comprised of a two-input NAND gate and a D-type flip-flop. The output of the NAND gate is connected to the clock terminal of the flip-flop and the data signal is directed to the data terminal of the flip-flop. A new clock scheme is provided with for this circuit configuration in order to properly store the data signal.

18 Claims, 3 Drawing Sheets

LOW POWER REGISTER MEMORY ELEMENT CIRCUITS

BACKGROUND OF THE INVENTION

1. Field of the Invention

The present invention generally relates to flip-flops and flip-flops used as register memory elements, and in particular, a low power flip-flop configuration and register architecture.

2. Background

A register is an array of memory elements (or flip-flops) that can temporarily store data or information in digital form. It is used extensively in modern digital circuitries and it is not uncommon to find banks and banks of registers in integrated circuits, especially in CPUs and controllers. FIG. 1 illustrates a simple databus 8 connected to two banks of registers, 12 and 14, via two sets of interconnects 16 and 18. Each set of the interconnects is comprised of a number of data lines and may include one or more write-enable lines as indicated at 20 and 22. The data bus typically is connected to other components as well, such as an accumulator or arithmetic unit, which are not shown. In implementation, the data lines of the data bus are connected to the individual memory elements forming the register.

Referring to FIG. 2, a simple prior art memory element is shown which includes a multiplexer 30 and a flip-flop 32. The multiplexer 30 has two input terminals, IN0 and IN1, a control switch terminal, S, and an output terminal, OUT. The flip-flop is a D-type flip-flop with a data input terminal, D, a clock terminal, CK, and an output terminal, Q. By providing the proper signal to the switch terminal of the multiplexer, the multiplexer selects one of the two inputs, and couples either the output signal from the flip-flop or the data signal to the output terminal OUT. Thus, when the clock signal is active and when the multiplexer is switched to the data signal, the flip-flop will store the signal from the data bus. If the multiplexer is switched to its other state to couple the signal at IN0 to the terminal OUT, the flip-flop 32 will latch the previously stored signal. While this configuration works well, it consumes a great deal of power in the process since the transistors of the multiplexer and flip-flop are always being operated on by the free running system clock, even when it is not necessary to change the signal stored in the flip-flop.

An improved high pulse gated clock configuration is illustrated in FIG. 3, including a two-input AND gate 40 and a D-type flip-flop 42. The AND gate 40 receives a WRITE-ENABLE signal and a CLOCK signal. When both of the signals are high, the AND gate generates a high signal at 41, pulling the terminal CK high and causing the DATA signal to be stored in the flip-flop 42. This high pulse gated clock configuration reduces power consumption with respect to the CLOCK terminal but it does not reduce power with respect to the DATA terminal. Whenever the data signal changes state, whether it is to be latched or not, electrical current passes through the transistors within the flip-flop 42 and in the process consumes power unnecessarily.

This condition can be explained via FIG. 4 which shows a common implementation of a D-type flip-flop using two latches 50 and 52. Here, the CK (clock) terminal in one path connects via an inverter 63 to a first transmission gate 60 and via another path to the same transmission gate. In a likewise manner, the CK terminal is also connected to a second transmission gate 62 in a manner that the state of the second transmission gate is opposite from that of the first transmission gate. So when the first transmission gate is open, the second transmission gate is closed and vice-versa.

When the signal from the CK terminal is low, it causes the first transmission gate to close, and the data signal is allowed to pass through and be latched by inverters 64 and 66. At this time, the second transmission gate 62 is open and the data signal is not passed to inverters 68 and 70. When the signal from the CK input goes high, gate 60 opens and gate 62 closes causing the DATA signal held by inverters 64 and 66 to be passed to inverters 68 and 70. The delay in the change of the signal state as the signal passes from inverters 64 and 66 to inverters 68 and 70 is a characteristic of the D (delay) type flip flop.

In prior art implementations, the first transmission gate of the flip-flop is kept closed by a low clock signal at the CK terminal. The first transmission gate being closed allows the DATA signal (from the data bus) to cause inverters 64 and 66 to continuously change state from low-to-high and high-to-low, burning power continuously.

In an ideal case, power consumption should occur only when the clock terminal of the flip-flop is activated, not when the data signal changes state. Thus, in order to minimize the power consumption of an integrated circuit, a new design is needed.

SUMMARY OF THE INVENTION

It is therefore an object of the present invention to provide a new register architecture that minimizes power consumption.

It is another object of the present invention to provide a new clock scheme to operate with the novel register architecture.

It is yet another objective of the present invention to provide a new flip-flop circuit configuration that minimizes power consumption.

Briefly, a presently preferred embodiment of the present invention is comprised of a two-input NAND gate and a D-type flip-flop. The output of the NAND gate is connected to the clock input of the flip-flop and the data signal is directed to the data input of the flip-flop. A new clock scheme is provided for this circuit configuration in order to properly store the data signal.

An advantage of the present invention is that it provides a new register architecture that minimizes power consumption.

Another advantage of the present invention is that it provides a new clock scheme to operate with the novel register architecture.

A further advantage of the present invention is that it provides a new flip-flop circuit configuration that minimizes power consumption.

These and other features and advantages of the present invention will become well understood upon examining the figures and reading the following detailed description of the invention.

IN THE DRAWING

DETAILED DESCRIPTION OF THE PREFERRED EMBODIMENT

Figure 5:
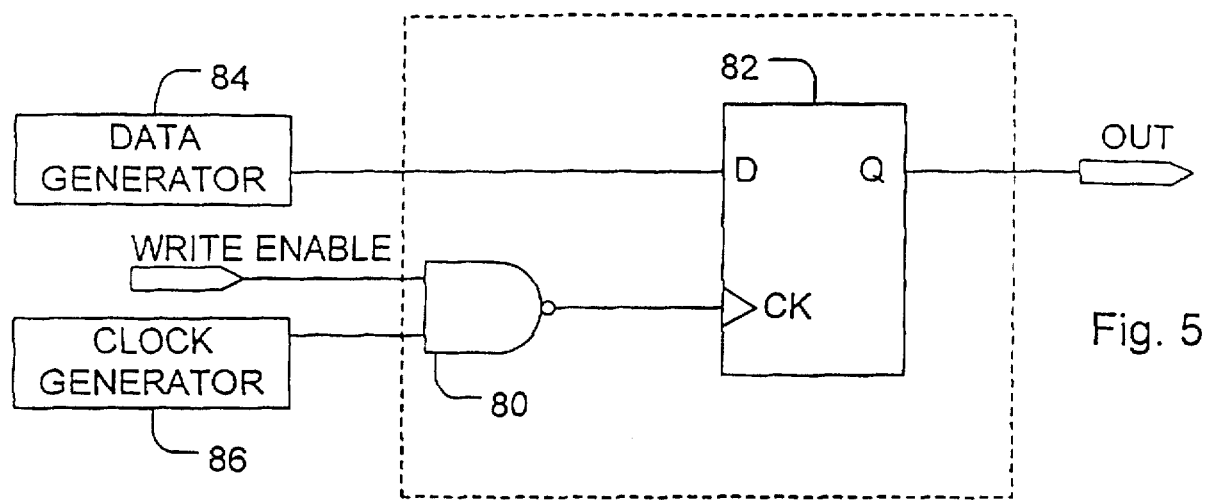
FIG. 5 is a preferred embodiment of the present invention, namely a register flip-flop driven low pulse gated clock.

Referring to FIG. 5, a preferred embodiment of a register memory element driven by low pulse gated clock is depicted and is comprised of a two-input NAND gate 80 and a D-type flip-flop 82. The NAND gate 80 receives as input the WRITE-ENABLE signal and a CLOCK signal from the clock generator 86. The output terminal of the NAND gate 80 is connected to the clock terminal of the flip-flop 82. The DATA signal is generated in accordance with a timing scheme as provided by a data generator 84 and is fed to the D-terminal of the flip-flop. The output signal of the flip-flop is generated at the Q-terminal.

Figure 4:
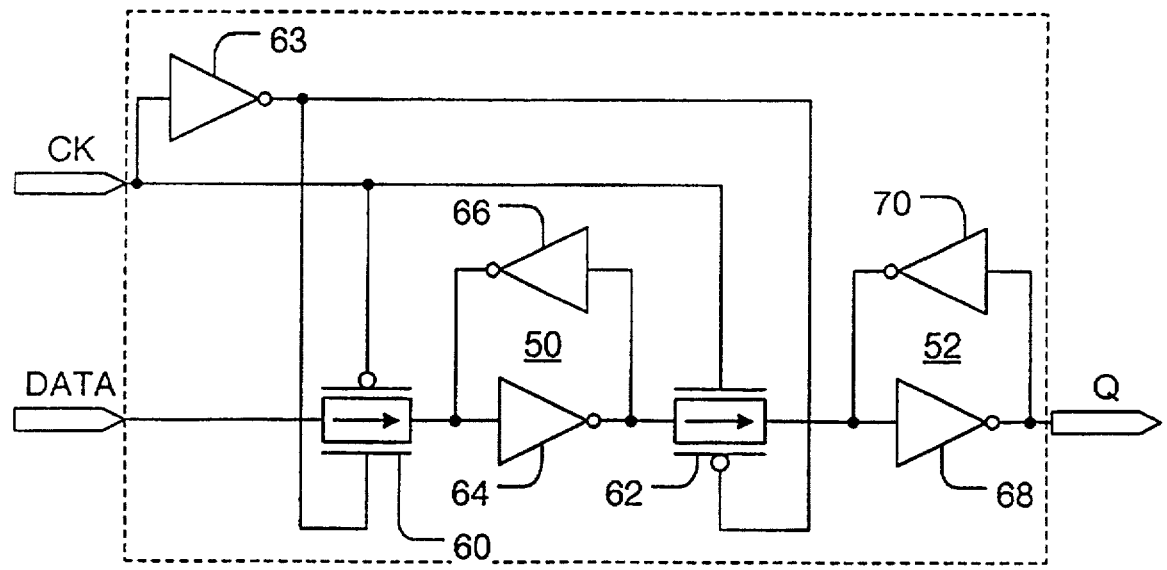
FIG. 4 is a schematic for a static flip-flop using two latches.

Using the flip-flop configuration illustrated in FIG. 4 for the flip-flop 82 in FIG. 5 the following table illustrates the states and the power consumption by the circuit:

| WRITE ENABLE | CLOCK SIGNAL | NAND GATE OUTPUT | FIRST TRANS. GATE | POWER CONSUMED |
| --- | --- | --- | --- | --- |
| 0 | 0 | 1 | open | no |
| 0 | 1 | 1 | open | no |
| 1 | 0 | 1 | open | no |
| 1 | 1 | 0 | closed | yes |

Here, power is consumed by inverters 64 and 66 only when the first transmission gate is closed, i.e., when the WRITE-ENABLE signal is high and the clock signal is high. In other cases, when one or both of the WRITE-ENABLE signal and CLOCK signal is in the low state, there is no power consumption.

Figure 1:
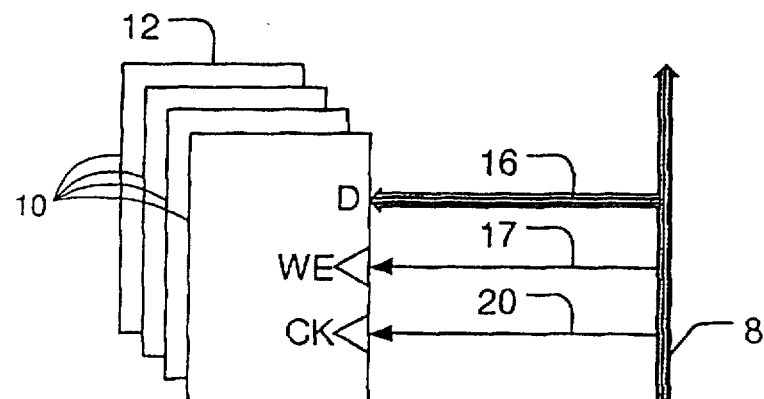
FIG. 1 is an illustration of a data bus connected to two registers, where each register is comprised of a number of memory elements.
Figure 1:
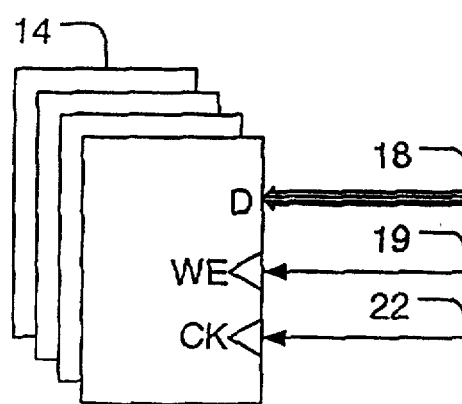
Figure 2:
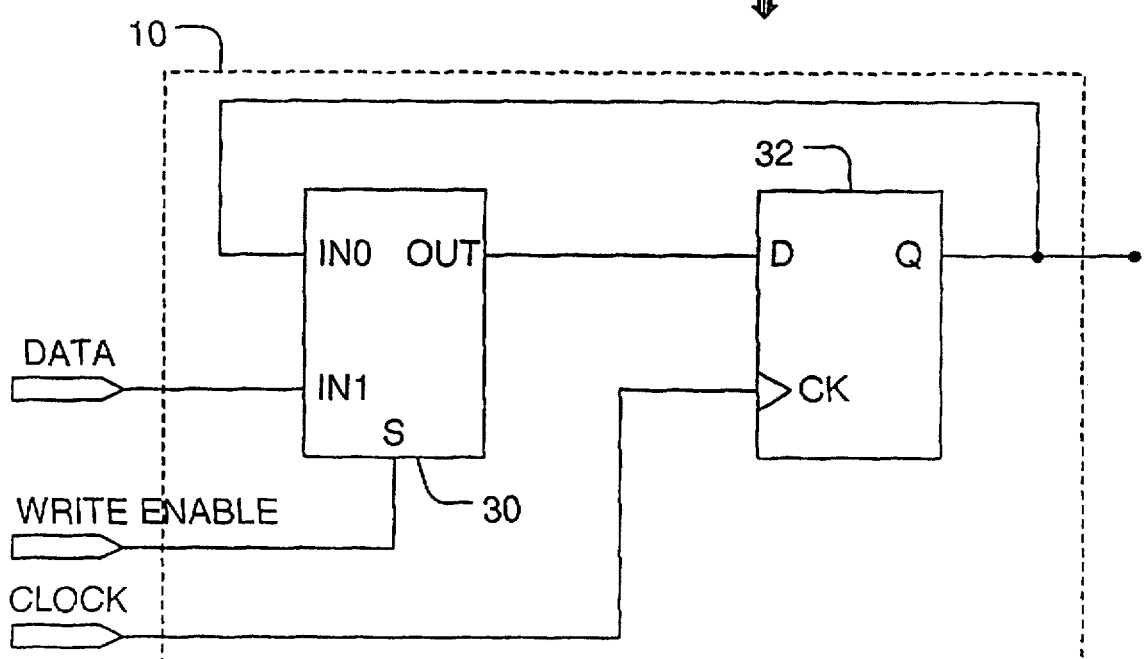
FIG. 2 is a prior art register memory element configuration driven by a free running system clock.
Figure 3:
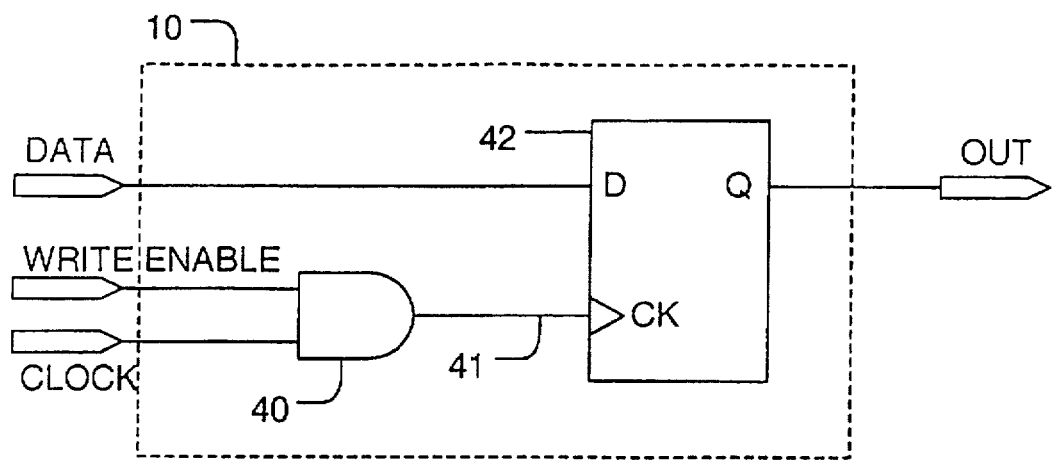
FIG. 3 is a prior art register memory element configuration driven by a high pulse gated clock.

In comparison, in the prior art configuration illustrated in FIG. 3 where an AND gate 40 is connected to the flip-flop, the following table illustrates the states and the respective power consumption by the prior art circuit:

| WRITE ENABLE | CLOCK SIGNAL | AND GATE OUTPUT | FIRST TRANS. GATE | POWER CONSUMED* |
| --- | --- | --- | --- | --- |
| 0 | 0 | 0 | closed | yes |
| 0 | 1 | 0 | closed | yes |
| 1 | 0 | 0 | closed | yes |
| 1 | 1 | 1 | open | no |

*power consumption by inverters 64 and 66

As is illustrated by the above table, in the prior art configuration, power is consumed even when the data signal is not to be latched, resulting in wasted power. This condition, as is explained above, is caused by the fact that the clock signal is in the low state even when the data is not to be stored.

Figure 6:
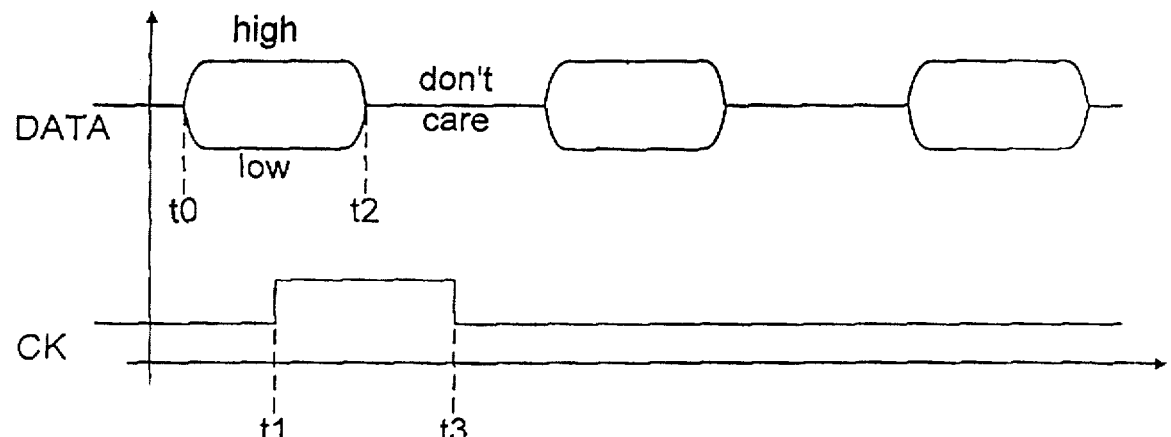
FIG. 6 is a timing diagram for the high pulse gated clock configuration of the prior art.

In using the above-described configuration of the preferred embodiment, the clock scheme has to be modified as well. Referring to FIG. 6, the timing diagram of the high pulse gated clock prior art configuration is illustrated. The DATA signal can be in one of the tristates, high, low, or don't-care states. When the DATA signal is to be stored, the control signal CK (at the clock terminal of the flip-flop) goes high at t1 to latch in the DATA signal and goes low at t3. Note that the control signal CK typically goes low at t3 after the DATA signal has changed to the don't-care state at t2.

Figure 7:
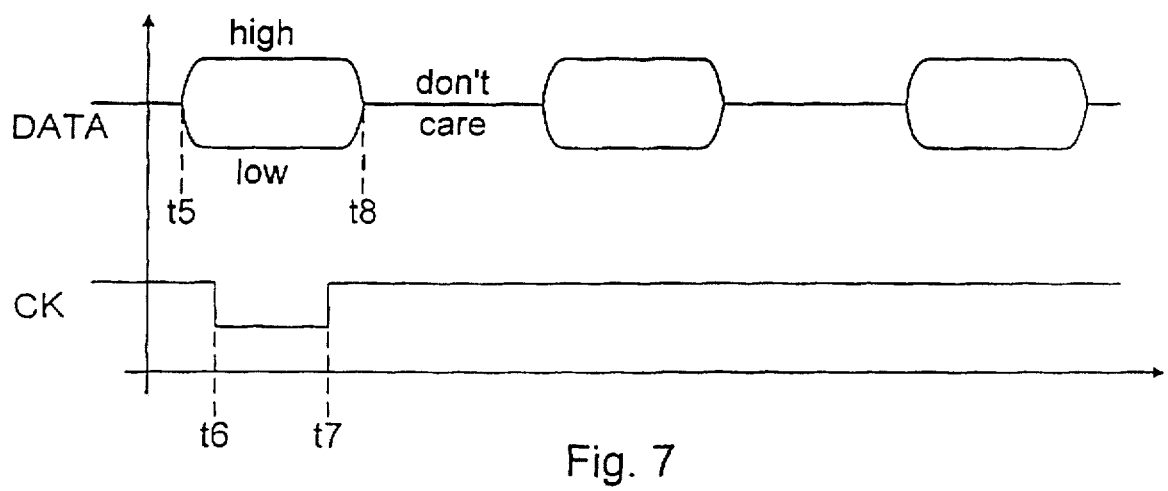
FIG. 7 is a timing diagrams for a low pulse gated register configuration in accordance with a preferred embodiment of the present invention.

For the preferred embodiment, referring to FIG. 7, the control signal CK is normally maintained at a high state. When a DATA signal (occurring between t5 and t8) is to be stored in the flip-flop, the control signal CK drops to a low state at time t6 and raises back to the high state at time t7, where t6 is at a time after t5, and t7 is at a time before t8. In this manner, the DATA signal is properly latched when the WRITE-ENABLE signal and the CLOCK signal are both high.

While the present invention has been described with reference to a preferred embodiment, it is to be understood that the present invention is not to be limited to such specific embodiment. Rather, it is the inventor's intention that the invention be understood and construed in its broadest meaning as reflected by the following claims. Thus, these claims are to be understood as incorporating not only the preferred embodiment described herein but all alterations and modifications that might be apparent to those of ordinary skill in the art.

What I claim is:

1. A low power memory circuit comprising:
a NAND gate having a first input terminal for receiving an input write-enable signal, a second input terminal for receiving a clock signal, and an output terminal upon which a control signal is generated as a function of said input write-enable signal and said clock signal; and
a flip-flop having a data terminal for receiving a data signal, a clock terminal connected to said output terminal of said NAND gate for receiving said control signal, and a data output terminal.

2. A low power memory circuit as recited in claim 1 wherein said flip-flop is operated to latch said data signal appearing on said data terminal when said control signal at said clock terminal is low.

3. A low power memory circuit as recited in claim 2 wherein to latch said data signal said control signal is low within a duration when said data signal is high.

4. A low power memory circuit as recited in claim 2 wherein to latch said data signal said control signal is low within a duration when said data signal is low.

5. A low power memory circuit as recited in claim 1 wherein said flip-flop is a D-type flip-flop.

6. A low power memory circuit as recited in claim 1 wherein a plurality of the low power memory circuits forms a register for receiving and storing multiple digital data values.

7. A low power memory circuit as recited in claim 1 wherein said clock signal is provided by a clock generator and said data signal is provided by a data generator.

8. A low power memory circuit as recited in claim 7 wherein in latching said data signal said clock generator generating said clock signal at an interval having a predetermined relationship with said data signal.

9. A low power memory circuit as recited in claim 8 wherein when said data signal is latched in said flip-flop when said control signal is low.

10. A low power memory circuit as recited in claim 8 wherein said control signal is low when said write-enable signal and said clock signal are high.

11. A low power memory circuit as recited in claim 8 wherein said clock generator causes said clock signal to go high within an interval when said data signal does not change state.

12. A memory circuit comprising:

a NAND gate having a first input terminal for receiving a write-enable signal, a second input terminal for receiving a clock signal, and an output terminal for generating a control signal in response to said write-enable signal and said clock signal;

a flip-flop having a data input terminal for receiving a data signal, a clock terminal connected to said output terminal of said NAND gate for receiving said control signal; and said memory circuit latches said data signal when said control signal is low.

13. A memory circuit as recited in claim 12 where said flip-flop is a D-type flip-flop.

14. A memory circuit as recited in claim 12 wherein a plurality of the circuits forms a register for receiving and storing multiple digital data values.

15. A memory circuit as recited in claim 12 wherein said clock signal is provided by a clock generator and said data signal is provided by a data generator.

16. A memory circuit as recited in claim 15 wherein in latching said data signal said clock generator generating said clock signal at an interval having a pre-determined relationship with said data signal.

17. A memory circuit as recited in claim 16 wherein said control signal is low when said write-enable signal and said clock signal are high.

18. A memory circuit as recited in claim 16 wherein said clock generator causes said clock signal to go high within an interval when said data signal does not change state.

* * * * *